(12) United States Patent
Nowak et al.

(10) Patent No.: US 10,909,443 B2
(45) Date of Patent: Feb. 2, 2021

(54) NEUROMORPHIC CIRCUIT STRUCTURE AND METHOD TO FORM SAME

(71) Applicant: GLOBALFOUNDRIES INC., Grand Cayman (KY)

(72) Inventors: Edward J. Nowak, Shelburne, VT (US); Siva P. Adusumilli, South Burlington, VT (US); Ruilong Xie, Niskayuna, NY (US); Julien Frougier, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 206 days.

(21) Appl. No.: 16/283,887

(22) Filed: Feb. 25, 2019

(65) Prior Publication Data

US 2020/0272880 A1 Aug. 27, 2020

(51) Int. Cl.
*G06N 3/04* (2006.01)
*H01L 27/24* (2006.01)
*H01L 45/00* (2006.01)
*H01L 29/872* (2006.01)

(52) U.S. Cl.
CPC ........... *G06N 3/04* (2013.01); *H01L 27/2409* (2013.01); *H01L 29/872* (2013.01); *H01L 45/08* (2013.01); *H01L 45/146* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 4,972,363 A | 11/1990 | Nguyen et al. | |
| 2011/0119214 A1* | 5/2011 | Breitwisch | G06N 3/0635 706/33 |
| 2012/0323833 A1 | 12/2012 | Markram et al. | |
| 2014/0089232 A1 | 3/2014 | Buibas et al. | |
| 2015/0088797 A1* | 3/2015 | Kim | G06N 3/049 706/29 |
| 2017/0033120 A1 | 2/2017 | Lee et al. | |

FOREIGN PATENT DOCUMENTS

| | | |
|---|---|---|
| CN | 108053848 A | 5/2018 |
| CN | 108206191 A | 6/2018 |
| EP | 1483737 A0 | 12/2004 |
| WO | 03079287 A2 | 9/2003 |
| WO | 20182311395 A1 | 12/2018 |
| WO | 201905769 A | 2/2019 |

* cited by examiner

*Primary Examiner* — Tan T. Nguyen
(74) *Attorney, Agent, or Firm* — Francois Pagette; Hoffman Warnick LLC

(57) ABSTRACT

Embodiments of the present disclosure provide a neuromorphic circuit structure including: a first vertically-extending neural node configured to generate an output signal based on at least one input to the first vertically-extending neural node; an interconnect stack adjacent the vertically-extending neural node, the interconnect stack including a first conducting line coupled to the first vertically-extending neural node and configured to receive the output signal, a second conducting line vertically separated from the first conducting line, and a memory via vertically coupling the first conducting line to the second conducting line; and a second vertically-extending neural node adjacent the interconnect stack, and coupled to the second conducting line for receiving the output signal from the first vertically-extending neural node.

20 Claims, 10 Drawing Sheets

NEUROMORPHIC CIRCUIT STRUCTURE AND METHOD TO FORM SAME

TECHNICAL FIELD

Embodiments of the disclosure relate generally to artificial neural network (ANN) technology. Specifically, the disclosure provides a neuromorphic circuit structure configured for use in ANNs, and related methods to form the same.

BACKGROUND

The manufacture and use of artificial neural networks (ANNs) is a fast-developing sector of electronics engineering. ANNs provide a signal processing infrastructure in which a product will remember and use frequent signal processing pathways in future operations. ANNs enable a product to remember, learn, and predict various electronics operations to suit different needs. ANN infrastructure is crucial to providing machine-learning features in a product. The power of ANN infrastructure depends on the capability of its individual components. In a natural neural network, e.g., the human central nervous system, individual nerve cells define fan-in/fan-out connections capable of connecting a single cell to over ten-thousand other cells. Conventional ANN infrastructure is far less capable than natural neural networks, and generally offers less than ten connections between a given artificial neuron and interconnected artificial neurons in the same network.

Various ANN architectures have attempted to increase the number of connections between individual neurons with limited success. Most commonly, an ANN may provide a stack of memory elements to connect the input of one neuron array to the output of another neuron array. As device scale and components continue to shrink, such an arrangement fails to comport with most device architectures. Still other proposed ANN configurations provide only hypothetical processing pathways between individual neurons, without detailing the infrastructure necessary to create such pathways in a device. The ever-increasing sophistication of ANN designs and device hardware also presents an obstacle to mass producing ANN technology at reasonable cost.

SUMMARY

A first aspect of the present disclosure provides a neuromorphic circuit structure, including: a first vertically-extending neural node configured to generate an output signal based on at least one input to the first vertically-extending neural node; an interconnect stack adjacent the vertically-extending neural node, the interconnect stack including a first conducting line coupled to the first vertically-extending neural node and configured to conduct the output signal, a second conducting line vertically separated from the first conducting line, and a memory via vertically coupling the first conducting line to the second conducting line; and a second vertically-extending neural node adjacent the interconnect stack, and coupled to the second conducting line for receiving the output signal from the first vertically-extending neural node.

A second aspect of the present disclosure provides a neuromorphic circuit structure, including: a first vertically-extending neural node configured to receive at least one excitatory input signal, and at least one inhibitory input signal, wherein the first vertically-extending neural node generates an output signal based on the at least one excitatory input signal and the at least one inhibitory input signal; an interconnect stack adjacent the vertically-extending neural node, the interconnect stack including a plurality of conducting lines alternating with a plurality of dielectric layers, wherein a first conducting line of the interconnect stack is coupled to the first vertically-extending neural node and configured to receive the output signal, one of the plurality of dielectric layers separates the first conducting line from a second conducting line of the interconnect stack, and a memory via vertically couples the first conducting line to the second conducting line; and a second vertically-extending neural node adjacent the interconnect stack, and coupled to the second conducting line for receiving the output signal from the first vertically-extending neural node.

A third aspect of the present disclosure provides a method to form a neuromorphic circuit structure, the method including: forming a first conducting line; forming an dielectric layer on the first conducting line; forming a memory via within the dielectric layer in contact with the first conducting line; forming a second conducting line on the dielectric layer, such that the memory via vertically connects the second conducting line to the first conducting line; forming a first opening and a second opening by removing respective portions of the first conducting line, the dielectric layer, and the second conducting line at locations horizontally displaced from the via, wherein the first opening is positioned directly alongside the first conducting line and the second opening is positioned directly alongside the second conducting line; forming a first and second vertically-extending neural node respectively within the first opening and the second opening, the first vertically-extending neural node being coupled to the first conducting line, and the second vertically extending neural node being coupled to the second conducting line.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
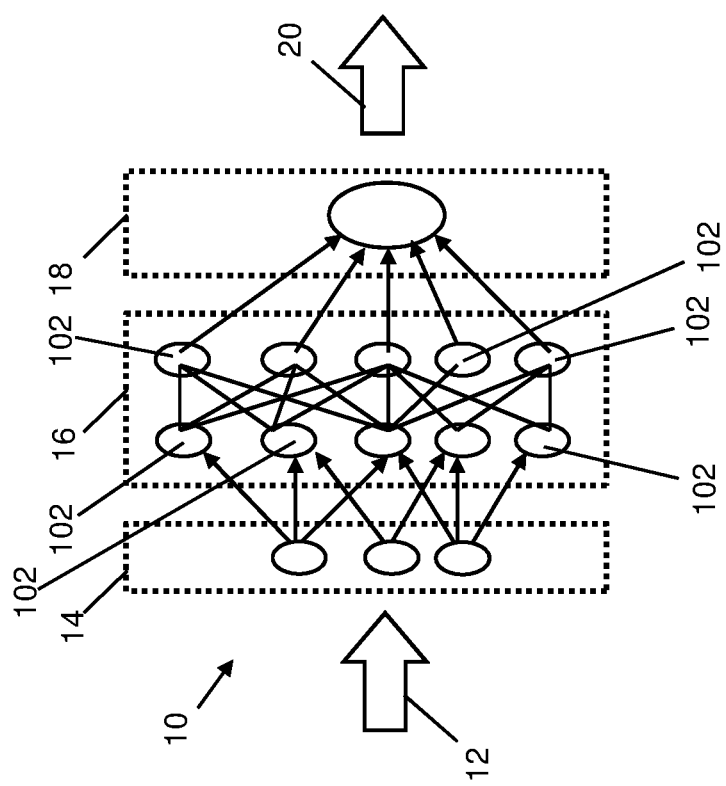
FIG. 1 shows a schematic view of signal pathways through an example artificial neural network (ANN).

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Turning to FIG. 1, an example artificial neural network (ANN) 10 is shown. ANN 10 may represent at least part of one or more computer systems and/or software components which can be programmed, adapted, or otherwise used to implement various processes. Embodiments of the present disclosure may be individual components making up some or all of a particular ANN 10.

ANN 10 may be configured to provide a mathematical (machine learning) model which relates one or more inputs 12 to one or more outputs 20. As successive groups of inputs are transmitted to ANN 10, the created mathematical model can be adjusted based on comparing various outputs to verified, ideal values and/or other related groups of inputs and outputs. Inputs 12 denote signals provided to ANN 10. An input layer 14 includes one or more nodes (e.g., neural nodes 102), i.e., individual structures for receiving one or more inputs to generate one or more outputs in a fan-in/fan-out configuration. Each node of input layer 14 can in turn be connected to other nodes in a hidden layer 16, which implement particular mathematical functions. Inputs 12 to input layer 14 can include, e.g., measurements, signals, commands, and/or other human or machine inputs relayed to ANN 10 for processing. Each node of input layer 14 and/or hidden layer 16 may include its own set of inputs and outputs. Signals from different pathways may represent different variables, operations, and/or other processes affecting the mathematical relationship between inputs and outputs of ANN 10. Each node of hidden layer 16 can include a corresponding weight ("W") representing a factor or other mathematical adjustment for converting input signals into output signals. The nodes of hidden layer 16 can eventually connect to an output layer 18, which transmits one or more signals as an output 20 corresponding to inputs 12.

To provide a type of machine learning in ANN 10, signals at output layer 18 can be compared with predetermined or ideal values to calculate errors in a process known as "error backpropagation." Where the error between an output signal at output layer 18 and a predetermined value exceeds a particular threshold, ANN 10 may include features for self-correction. For example, process steps encoded in hardware and/or software can use values in output layer 18 to adjust weights W of hidden layer 16 and or connections between nodes of input layer 14 and hidden layer 16. In an example embodiment, error backpropagation can include "Bayesian Regulation," a series of mathematical steps leveraging probability for weight calculations to minimize the mean squared error (MSE) (i.e., the squared value of the difference between an output and a predetermined value, whether positive or negative) between values in output layer 18 and the predetermined values. This helps in generalizations and avoids overfitting data. Thus, ANN 10 can develop and adjust mathematical models by processing multiple inputs 12 to generate output 20, and compare output 20 to corresponding estimates.

Figure 2:
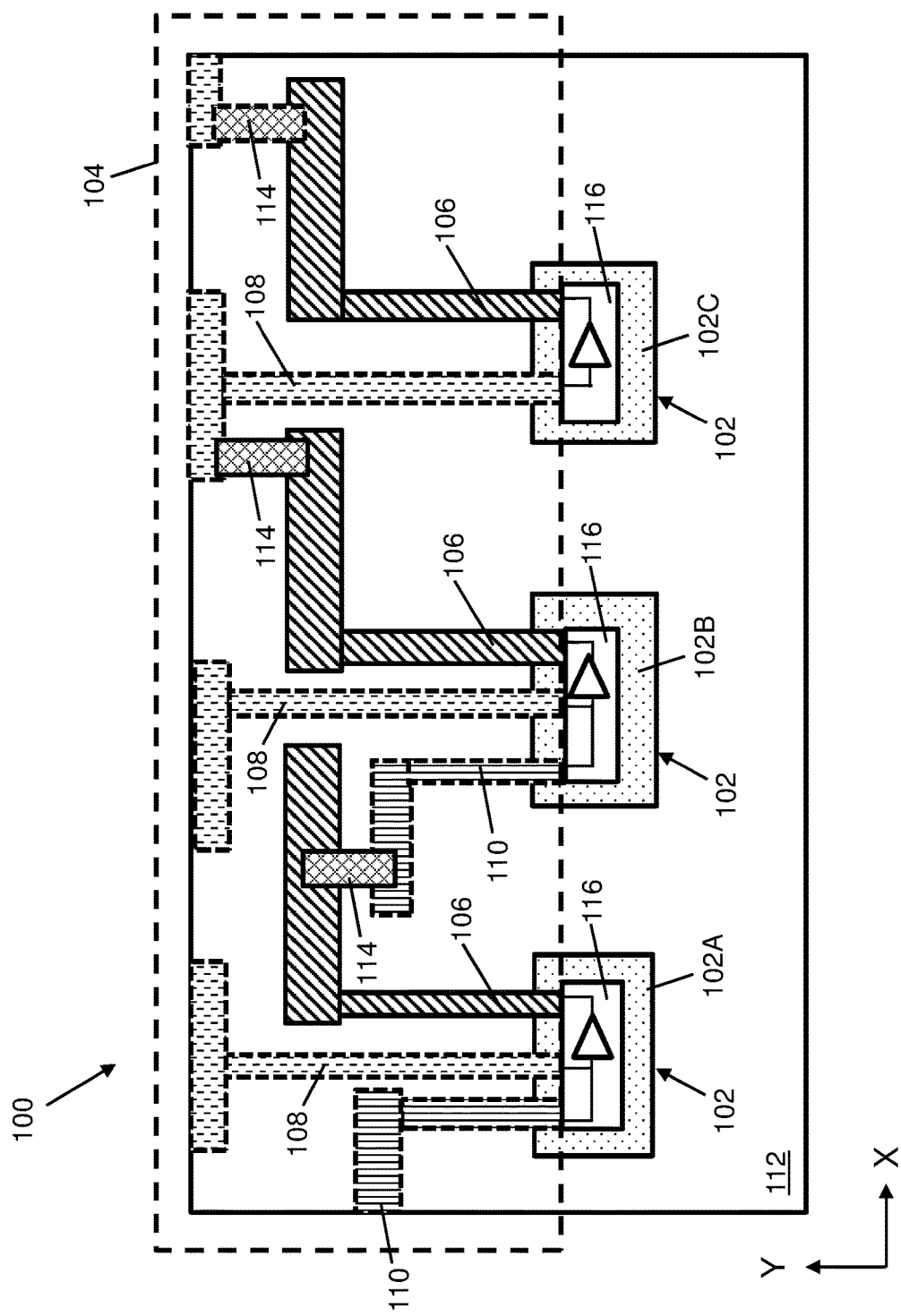
FIG. 2 shows a top-down schematic view of a neuromorphic circuit structure according to embodiments of the disclosure.
Figure 3:
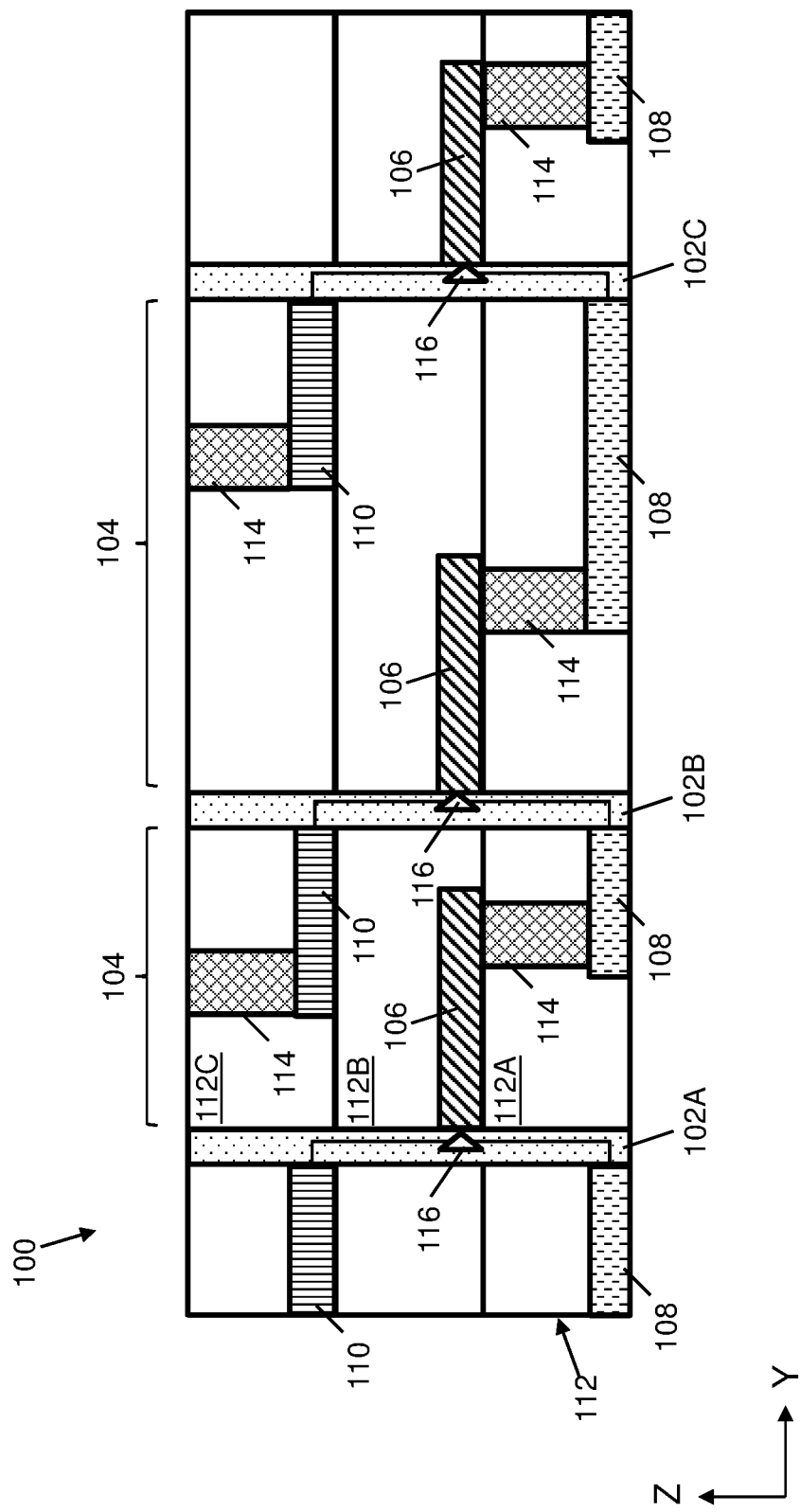
FIG. 3 shows a cross-sectional schematic view of a neuromorphic circuit structure according to embodiments of the disclosure.

Referring initially to FIGS. 2 and 3 together, a neuromorphic circuit structure (simply "structure" hereafter) 100 is shown according to various embodiments. FIG. 2 depicts structure 100 in plane X-Y according to a first example embodiment, while FIG. 3 depicts structure 100 in plane Z-Y according to another example embodiment. Various portions of structure 100 depicted in FIG. 2 appear in different locations within FIG. 3 for ease of illustration and to show possible variation between embodiments. Additionally, some components of structure 100 are shown in FIG. 2 with phantom lines to indicate that they may be positioned above or below the X-Y cross-section shown in FIG. 2. The various components of structure 100 discussed herein may be operationally consistent between embodiments, despite possible differences in their location. Structure 100 may be composed of multiple vertically-extending neural nodes (simply "neural nodes" hereafter) 102 extending transversely to plane X-Y, e.g., as shown in FIG. 3. It is understood that structure 100 may include any desired number of neural nodes 102 interconnected according to embodiments of the disclosure. Three neural nodes 102 are shown in structure 100 of FIGS. 2 and 3 to illustrate how other components may interconnect neural nodes 102 with each other.

Neural nodes 102 are analogous to individual nerve cells in a biological network. That is, each neural node 102 is structured to include one or more inputs (i.e., dendrites) for accepting signal inputs to be processed and relayed to other neural nodes 102 in structure 100. As noted in further detail below, neural nodes 102 may be structured to receive multiple excitatory inputs and/or inhibitory inputs, which may be converted to an output signal and relayed to other neural nodes 102 and/or output from ANN 10 (FIG. 1). A fundamental feature of both natural and artificial neural networks is the ability of the network to remember pathways between individual cells over a lifetime, such that more commonly-used pathways will transmit signals more quickly as they are used repeatedly. In an artificial neural network such as ANN 10, neural nodes 102 each make up one of the individual cells in a layer, and may be interconnected to other cells along different pathways.

Neural node 102 of structure 100 may include or otherwise be formed within a semiconductor substrate. In further examples, neural nodes 102 may include conductive metal lines, which may be formed planarly within structure 100. In the case of semiconductor material, substrate material of neural node 102 may include a base semiconductor material suitable to form one or more devices, and in some cases may be a foundation for subsequently-formed metal wiring levels of a structure. Substrate material(s) within neural node 102 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Where neural node 102 includes a conductive material such as a metal line, various components connected thereto (e.g., input and output lines) may similarly include conductive metals configured to form a Schottky barrier as noted elsewhere herein.

Structure 100 may include an interconnect stack 104 positioned adjacent to neural node 102. Interconnect stack 104 may include multiple vertically-stacked layers of insulating material, each having one or more electrically conductive lines 106 as shown in FIG. 3. Each conductive wire included in interconnect stack 104 may be configured to transfer input signals into, or output signals away from, each neural node 102. Interconnect stack 104 of structure 100 differs from conventional ANN technology by dedicating each conductive layer to a respective type of signal, e.g., excitatory inputs, inhibitory inputs, outputs, etc. This stacked arrangement of conducting wires may allow a circuit designer to connect neural nodes 102 together according to a particular design, and as noted herein may allow vertically-extending memory vias to connect the various layers of interconnect stack 104. Interconnect stack 104 may include, e.g., a first conducting line 106 coupled to one neural node 102. First conducting line 106 may take the form of a metal wire composed of any currently known or later-developed electrically conductive material including, e.g., copper (Cu), aluminum (Al), silver (Ag), gold (Au), combinations thereof, as well as non-metallic conductors, such as carbon nanotubes, etc.

Figure 5:
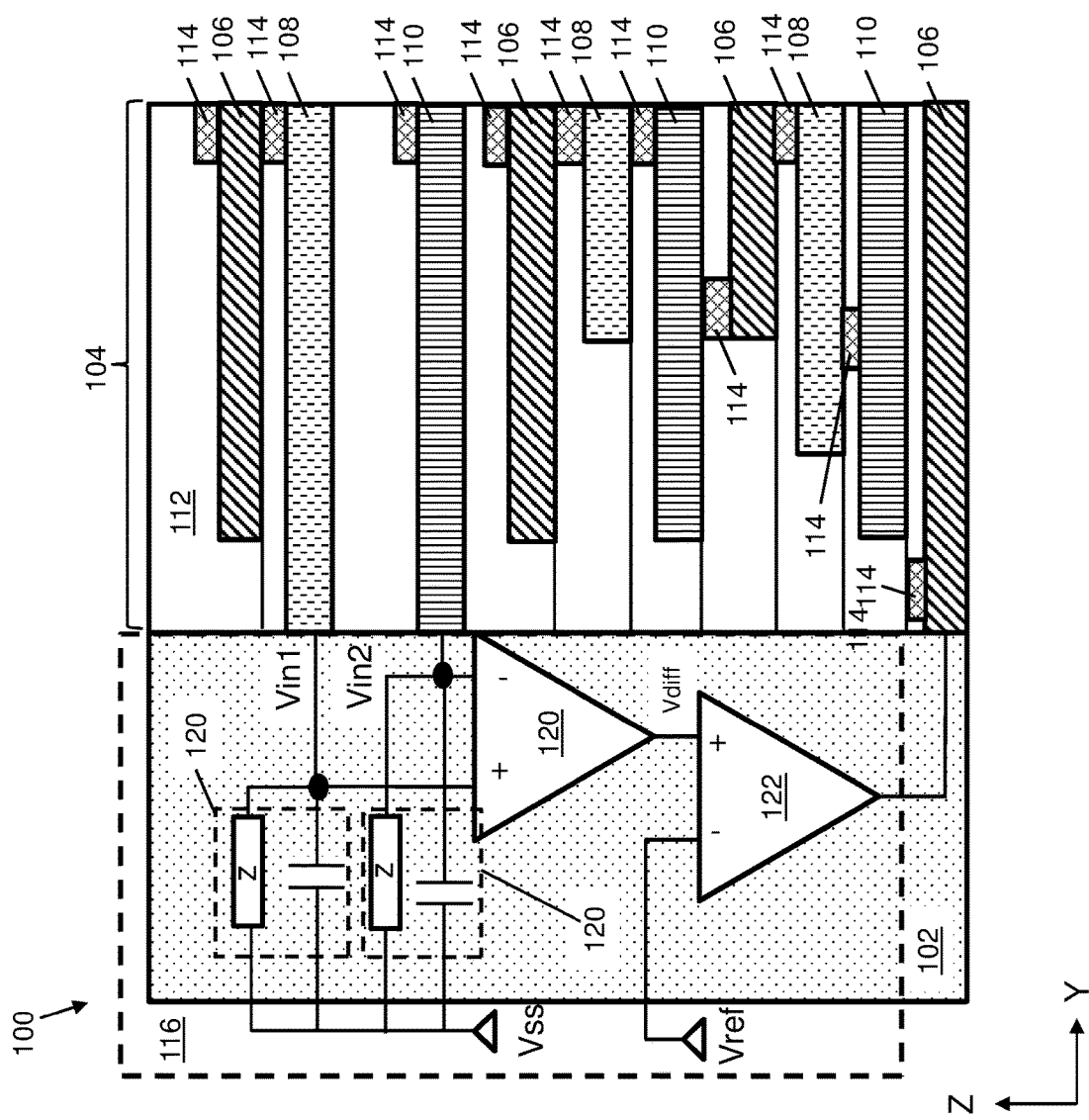
FIG. 5 shows an expanded cross-sectional schematic view of a neural node and interconnect stack according to embodiments of the disclosure.

Interconnect stack 104 may also include one or more second conducting lines 108, each vertically separated from first conducting line(s) 106. First and second conducting lines 106, 108 are illustrated with different cross-hatching solely to emphasize their function of transmitting different types of signals. Each conducting line 106, 108 may be composed of the same material or different conductive materials. Second conducting line may be electrically coupled to a different neural node 102. As shown, first and second conducting lines 106, 108 may be in at least partial vertical alignment with each other but connected to different neural nodes 102, e.g., 102A and 102B, respectively. First conducting line 106 may be positioned in a layer of interconnect stack 104 configured to transmit output signals from respective neural nodes 102, while second conducting line 108 may be positioned in a layer of interconnect stack 104 configured to transmit input signals to neural nodes 102. Interconnect stack 104 may also include a third conducting line 110 electrically coupled to neural node 102 in parallel with second conducting line 108. In this arrangement, second conducting line 108 may transmit an excitatory input to neural node 102, while third conducting line 110 may transmit an inhibitory input to neural node 102. Internal features of each neural node 102 may process excitatory and inhibitory inputs to transmit an output signal through first conducting line 106. An example of such internal features of neural node(s) 102 is shown in FIG. 5 and discussed in further detail elsewhere herein.

Each conducting line 106, 108, 110 may be positioned within a respective dielectric layer 112 of interconnect stack 104. Dielectric layer(s) 112 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. The various dielectric layers 112 of interconnect stack are identified separately in FIG. 3, i.e., as 112A, 112B, 112C. Each dielectric layer 112 may contain only one type of conducting line therein. For example, dielectric layer 112A may only contain second conducting line(s) 108 for transmitting input signals to neural nodes 102, dielectric layer 112B may only contain first conducting line(s) 106 for transmitting output signals from neural nodes 102, insulator 112C may only contain third conducting line(s) 110 for transmitting different input signals to neural nodes 102. In this arrangement, interconnect stack 104 may be designed to include a predetermined number of input and/or output layers for transmitting signals into and away from individual neural nodes 102. Interconnect stack 104 may vary in size between implementations, and in various embodiments may have as many as ten or more different memory vias 114 each connected to a respective conductive line 106, 108, 110 and corresponding portions of neural node(s) 102. By contrast in conventional ANN structures, individual layers may contain conductive lines for inputs and/or outputs as well as memory elements, which provides a less-modular architecture and may require forming horizontally-oriented neural nodes.

To electrically couple neural nodes 102 of structure 100 together, interconnect stack 104 includes a set of memory vias 114 each vertically coupling a respective pair of conducting lines 106, 108, 110. FIG. 3 in particular illustrates memory vias 114 which extend vertically from first conducting line 106 to second conducting line 108. In this case, memory vias 114 may deliver an output signal from first conducting line 106 to second conducting line 108, thereby transmitting an input signal to a different neural node 102 of structure 100. Memory vias 114 include distinct material and electrical properties from conducting lines 106, 108, 110, and other conventional wires or vias in electronics. Memory vias 114 provide machine learning hardware by having a variable conductivity. At the time of manufacture, memory vias 114 may have a state with higher electrical resistance than other conductive elements (e.g., conducting lines 106, 108, 110) of structure 100. When electrical current travels across memory via(s) 114, their electrical resistance decreases proportionately to the amount of electrical current. As signals continue to propagate through structure 100, memory via(s) 114 will become increasingly conductive with more frequent use. Thus, as structure 100 operates and signals are transmitted repeatedly across specific pathways, memory vias 114 will "remember" favored pathways and provide lower electrical resistance across such pathways. Meanwhile, less commonly-used memory vias 114 will have higher amounts of resistance. During operation, the varying resistance of memory vias 114 will cause frequently activated pathways to operate more quickly than less frequent activated pathways.

Memory vias 114 may include any currently known or later developed electrical material with a variable conductance. The conductance of memory via(s) 114 may depend on past levels of electrical current transmitted therethrough, as noted above. Memory vias 114 may be formed as unidirectional memristors, i.e., a two-terminal electrical pathway configured to propagate signals in only one direction, and with a resistance dependent on past current flowing through the structure. Uni-directional memristors exhibit a non-constant resistance, and initially may have a high resistance before being subjected to current flow across its terminals. The electrical resistance of a memristor will reduce in response to receiving and transmitting signals, as noted above, even after a power cycle of the device. The ability of a memristor to store and recall a particular electrical resistance is known in the art as the non-volatility property. Memory vias 114 thus may include a uni-directional memristor or other circuit elements which include the non-volatility property or similar characteristics. According to an example, memory vias 114 may include a uni-directional memristor formed of oxygen-depleted titanium oxide ($TiO_{2-x}$), or other titanium-oxide materials. Such materials will exhibit the non-volatility property when processed into electrical wires or vias, e.g., memory vias 114. Memory vias 114 in an example embodiment may be directional, or electrically rectifying, to form uni-directional memristors, to isolate differing output conducting lines to a common input conducting line, from one another. This may be accomplished, for example, by including a Schottky barrier interface in series with the uni-directional memristor. Schottky barriers are generally formed by a metal contacting a lightly doped semiconductor. In this case, memory vias 114 may include a uni-directional memristor electrically in series with a Schottky barrier diode. When a first interconnect presents a signal, or pulse, to an input interconnect, other output interconnects will not receive the signal because of the blocking action of the Schottky barrier diodes in their respective memory vias.

As shown in FIGS. 2 and 3, memory vias 114 may extend vertically between aligned portions of two conducting lines, e.g., first conducting line 106 and second conducting line 108. In further examples, memory vias 114 may vertically connect any two vertically-aligned portions of two conducting lines such as first, second, or third conducting lines 106, 108, 110. As noted elsewhere herein, interconnect stack 104 may have any desired number of layers, each having conducting lines 106, 108, 110 for transmitting inputs and outputs between neural nodes 102. Memory vias 114 thus may vertically connect conducting lines 106, 108, 110 within interconnect stack 104, thereby forming a pathway between neural nodes 102. As signals pass through specific memory vias 114 from one neural node 102 to another, transmitted signals will more easily traverse the frequently used, and less electrically resistive, pathways in structure 100.

Figure 4:
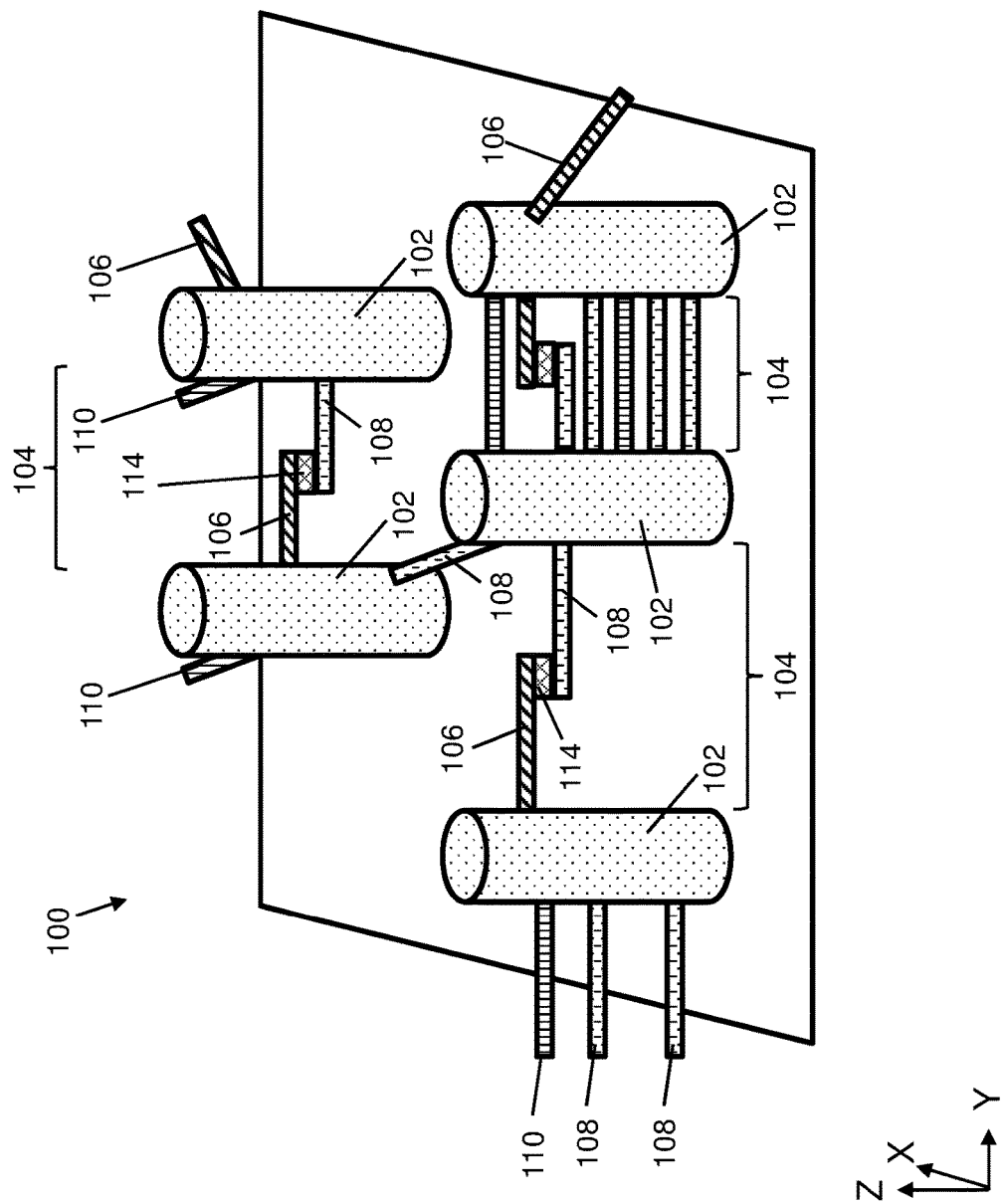
FIG. 4 shows a perspective view of a neuromorphic circuit structure according to embodiments of the disclosure.

Referring briefly to FIG. 4, a partial perspective view of structure 100 is shown to illustrate possible arrangements of neural nodes 102 and interconnect stack(s) 104 therebetween. Dielectric layer(s) 112 are omitted from FIG. 4 solely for ease of illustration. In the example of FIG. 4, each neural node 102 may extend vertically through structure 100, with conducting line(s) 106, 108, 110 extending radially outward from neural node 102. First conducting lines 106, when transmitting output signals, may provide the fan-out connections from neural node 102. Second and third conducting lines 108, 110, when transmitting input signals, may provide the fan-in connections to neural node 102. In each case, memory vias 114 vertically connect different sets of conducting lines 106, 108, 110 to create an electrical pathway between neural nodes 102.

FIG. 5 provides an expanded cross-sectional view of interconnect stack 104 alongside one neural node 102. As shown, interconnect stack 104 may include a set of ten or more memory vias 114 for transmitting outputs from a first neural node to inputs to other neural nodes. One neural node 102 may be electrically coupled to only selected conducting lines 106, 108, 110 of interconnect stack 104, or may be connected to each conducting line 106, 108, 110 of interconnect stack 104. In the example of FIG. 5, a portion of neural node 102 receives an excitatory input signal from second conductive line 108, an inhibitory input signal from third conductive line 110, and generates an output signal at first conductive line 106. The structure shown in FIG. 5 may represent, e.g., an operation for comparing positive excitatory inputs against positive inhibitory inputs to implement a logic function of the circuit. Neural node 102 thus may include a voltage-controlled mono stable vibrator ("VCMV") 116 for accepting two input signals, comparing the input signals, and generating an output signal based on the comparison between the two input signals. Although VCMV 116 is integrated into neural node 102 in FIG. 5, it is understood that other circuit structures for generating an output signal based on one or more input signals are also possible. As known in the art, VCMV 116 may be formed within substrate 102 by forming multiple doped regions of semiconductor substrate and interconnecting such regions through P-N junctions, capacitive opposite-polarity junctions, etc., to produce desired electrical behavior.

A supply voltage (Vss) and a reference voltage (Vref) may be coupled to VCMV 116 to provide amplification and reference voltages during operation. Excitatory input signals to VCMV 116 from second conductive line 108 may define a first input voltage (Vin1) to VCMV 116. Inhibitory input signals to VCMV 116 from third conductive line 110, where applicable, may define a second input voltage (Vin2) to VCMV 116. Each input voltage may be coupled to supply voltage Vss through one or more impeding elements 120, generally represented as a respective parallel impedance-capacitance element coupled between Vss and first or second conductive line(s) 108, 110. Each voltage input may be transmitted to a differential amplifier 120 configured to convert the excitatory and inhibitory input signals into a differential input signal (Vdiff). Differential amplifier 120 may be configured to accept two different input signals, and generate an output signal representing the difference between the two received input signals. When only excitatory input signals enter differential amplifier 120, Vdiff may be proportionate to the excitatory input signal(s) entering differential amplifier 120. By contrast, Vdiff may have a smaller magnitude than the original excitatory input signal when a combination of excitatory and inhibitory input pulses arrive at neural node 102.

VCMV 116 may be configured to generate signal pulses when the magnitude of the differential input signal Vdiff exceeds a reference voltage (Vref) also supplied to VCMV 116. A signal amplifier 122 receives Vdiff as a first input and Vref as a second input, and may output signal pulses only when Vdiff exceeds Vref. Furthermore, signals generated in signal amplifier 122 may have a frequency that is proportionate to the amount of difference between Vdiff and Vref. The reference voltage Vref may be supplied from a power source different from Vss, or may be supplied from supply voltage Vss. Thus, VCMV 116 may be configured to generate an output voltage with a frequency dependent on the voltage difference between Vdiff and Vref. The combination of differential amplifier 120 and signal amplifier 122 thus allows neural node 102 to accept excitatory and inhibitory reference signals from conducting lines 108, 110, and selectively generate output signal pulses at first conductive line 106. During operation, inhibitory input signals will increase the necessary magnitude of excitatory input signals for generating signal pulses, thereby allowing each neural node 102 to implement a particular logic function. The ability of neural nodes 102 to communicate with each other through interconnect stack 104 allows structure 100 to function as an ANN architecture, e.g., by sending and receiving signals across more frequently-used electrical pathways.

Figure 6:
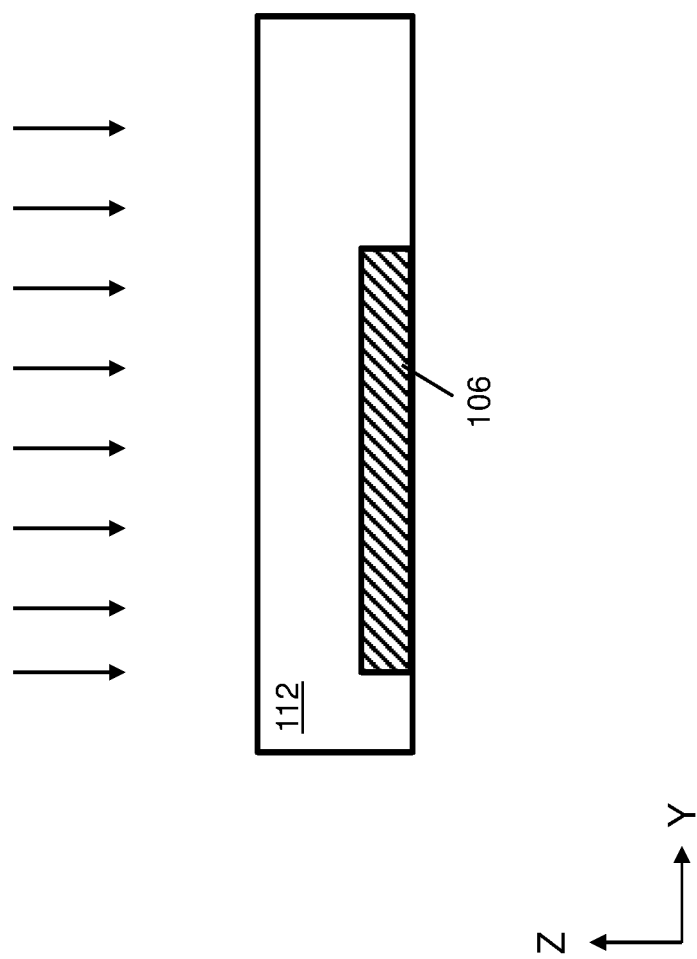
FIG. 6 shows a cross-sectional view of forming a first conductive line and dielectric layer according to embodiments of the disclosure.

Turning to FIG. 6, embodiments of the disclosure may provide a method to form structure 100 (FIGS. 2-5). Embodiments of the method discussed herein may be operable to form any desired arrangement of neural nodes 102 (FIGS. 2-5), interconnect stack(s) 104 (FIGS. 2-5) and various subcomponents. Initially, methods according to the disclosure may include forming the various components of interconnect stack 104 with a desired shape, and subsequently forming neural nodes 102 to interconnect the conductive elements within interconnect stack 104.

According to an embodiment, the method may include forming first conductive line 106 as a layer of conductive material (e.g., on an underlying substrate, dielectric layer, etc.—not shown). First conductive line 106 may be formed by deposition to define a conductive pathway for transmitting signals to a subsequently formed neural node. As used herein, "deposition" or "depositing" a material (e.g., first conductive line 106) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed. The material deposited to form first conductive line 106 may include any one or more of the example conductive materials discussed elsewhere herein. To define the shape of first conductive line 106, portions of the deposited conductive material may be etched with the aid of a temporary mask (not shown) to yield the desired shape of conductive line 106. Subsequently-formed conductive lines may be formed in substantially the same manner.

Methods according to the disclosure may also include forming insulator layer 112 over first conductive line 106. Insulator layer 112 may be formed by depositing one or more electrically insulative materials on first conductive line 106 to a desired height above first conductive line 106. As shown, insulator layer 112 may create a zone of vertical separation between first conductive line 106 and the upper surface of insulator layer 112. The height of insulator layer 112 thus may vertically separate first conductive line 106 from subsequently-formed layers of conductive material. As discussed elsewhere herein, memory elements such as memory vias 114 (FIGS. 2-5) may vertically connect different conductive layers together, thereby forming a connection between different neural nodes in a structure.

Figure 7:
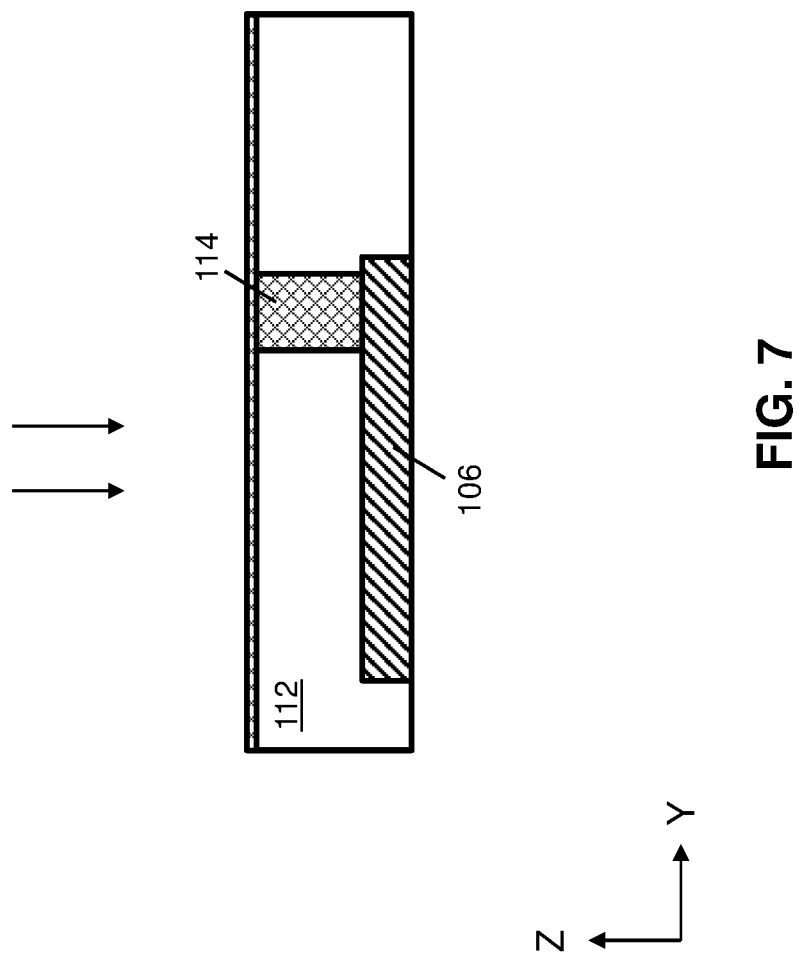
FIG. 7 shows a cross-sectional view of forming a memory via in the dielectric layer according to embodiments of the disclosure.

Referring to FIG. 7, the disclosure may include forming memory via 114 within insulator layer 112, and in contact with first conducting line 106. The forming of memory via 114 may include forming an opening within insulator layer 112 above first conducting line 106 (e.g., by etching), and filling the opening with one or more materials suitable to form memory via 114. According to one example, forming memory via 114 may include depositing a titanium oxide (TiO$_{2-x}$) on first conducting line 106 and filling the noted opening. As shown, the deposited memory via 114 material may also initially coat an upper surface of insulator layer 112. The deposited material may be subsequently removed, e.g., by chemical mechanical planarization (CMP) before other materials are formed on insulator layer 112 and memory via 114.

Figure 8:
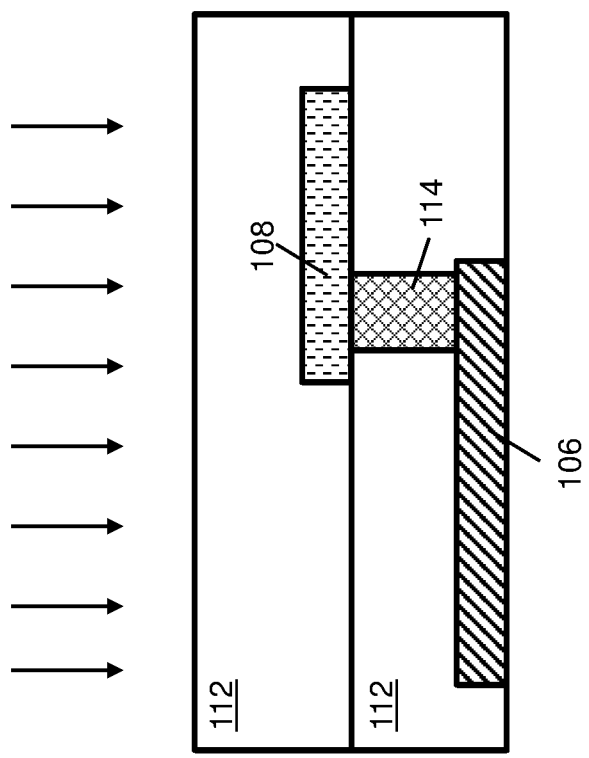
FIG. 8 shows a cross-sectional view of forming a second conductive line and dielectric layer according to embodiments of the disclosure.

FIG. 8 illustrates a process to form a second conducting line 108 on memory via 114 and insulator layer 112. Second conducting line 108 may be formed in substantially the same manner as first conducting line 106, e.g., depositing a conductive metal on insulator layer 112 and memory via 114, and subsequently etching portions of the deposited conducting material to form a desired shape. As discussed with respect to other processes, another insulator layer 112 may be deposited over second conducting line 108 to vertically separate second conducting line 108 from subsequently formed materials. In any case, memory via 114 may vertically connect first and second conducting lines 106, 108 to form a pathway for electrical current in the eventual structure. The processes shown in FIGS. 6-8 may be repeated as many times as desired to form subsequent conducting lines 106, 108, 110 (FIGS. 2-5, 9, 10) and memory vias 114 in desired locations.

Figure 9:
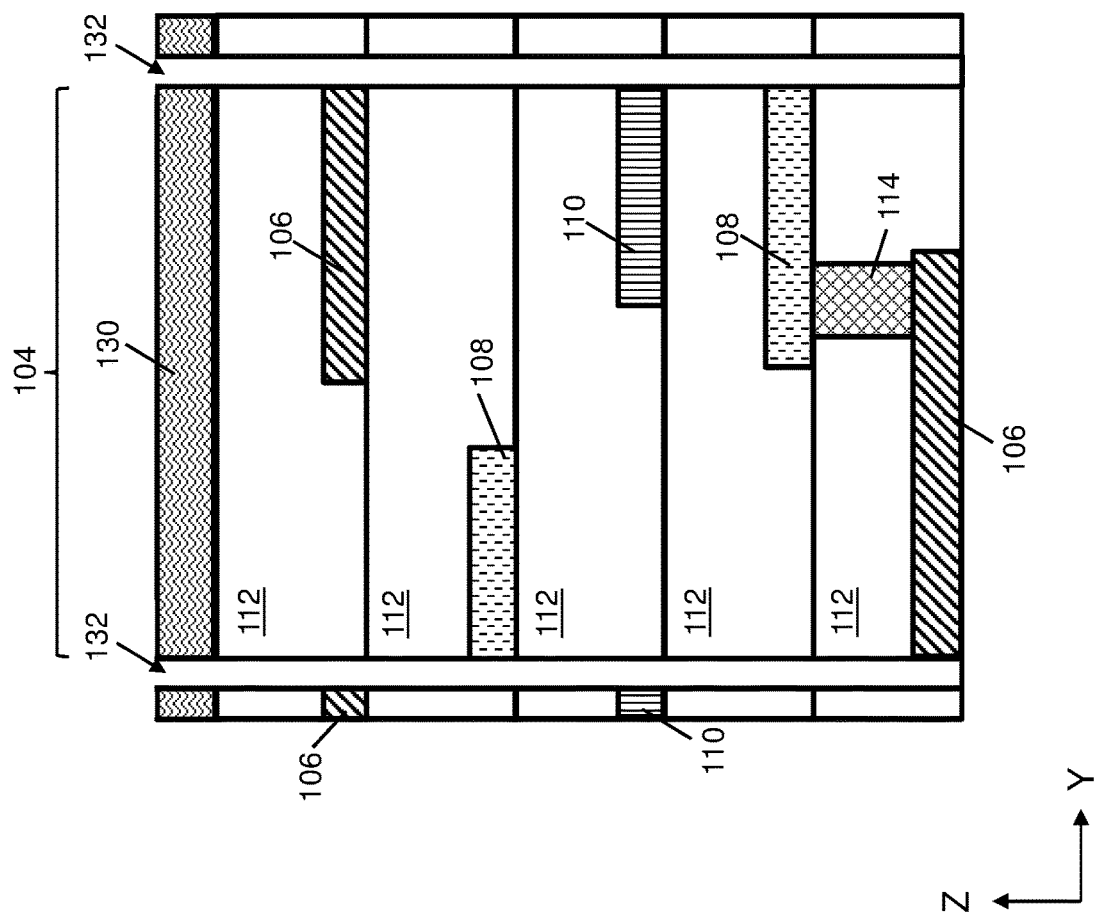
FIG. 9 shows a cross-sectional view of forming an interconnect stack and a pair of openings according to embodiments of the disclosure.

Continuing to FIG. 9, subsequent processing may be operable to form the neural nodes for receiving inputs and transmitting outputs through an ANN structure. FIG. 9 shows a partially completed structure with interconnect stack 104 in place. Interconnect stack 104 may be formed by repeatedly implementing the processes depicted in FIGS. 6-8 and discussed above to form multiple conductive lines 106, 108, 110 and insulator layers 112. Five layers of interconnect stack 104 are shown solely as an example, and it is understood that interconnect stack may include any desired number of layers (e.g., ten layers, fifty layers, one-hundred layers, several hundred layers, etc.). Thus, interconnect stack 104 may have any desired number of conducting lines 106, 108, 110 included therein. After forming interconnect stack 104 to a desired height, subsequent processing may include forming a mask 130 on interconnect stack 104. Mask 130 may include several openings 132 (two shown in FIG. 9) configured for removing underlying portions of interconnect stack 104. After forming mask 130, continued processing may include downwardly directionally etching non-selectively (e.g., by reactive ion etch (RIE)) portions of interconnect stack to form openings where neural nodes may be formed. The downward directional etch may remove portions of each insulator layer 112 and underlying portions of conducting lines 106, 108, 110 horizontally displaced from respective memory vias 114. The etching may cause openings 132 to be positioned directly alongside respective portions of conducting lines 106, 108, 110 of interconnect stack 104.

Figure 10:
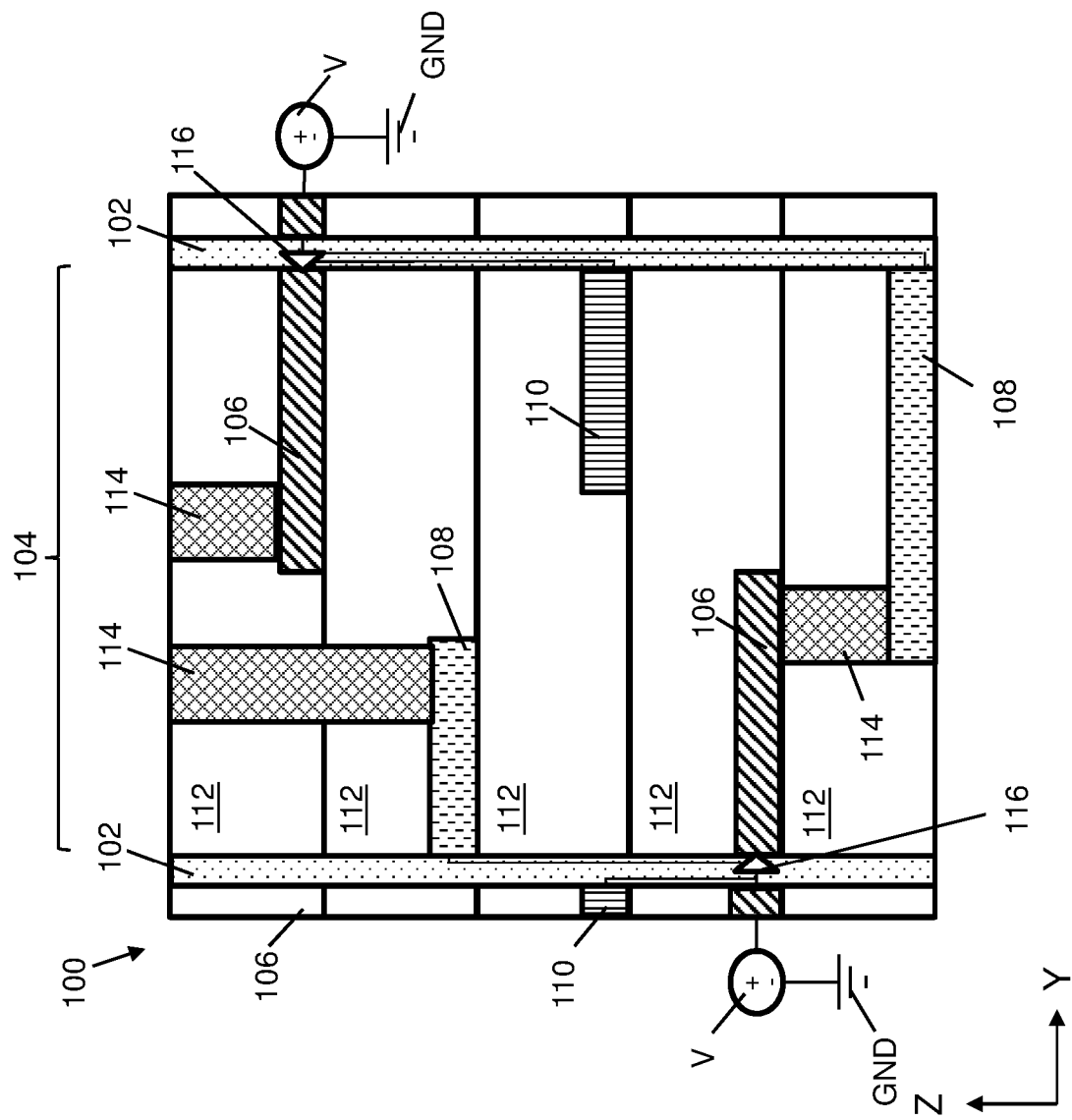
FIG. 10 shows a cross-sectional view of forming vertically-extending neural nodes adjacent the interconnect stack according to embodiments of the disclosure.

FIG. 10 depicts a process to form structure 100 by forming neural nodes 102 within openings 132 (FIG. 9). As shown, forming neural nodes 102 may include depositing doped or non-doped semiconductor material within openings 132 to a desired height. The forming of neural nodes 102 may include, e.g., depositing non-doped semiconductor material in locations where neural nodes 102 do not contact any conducting lines 106, 108, 110, and forming p-type and/or n-type doped semiconductor materials in contact with conducting lines 106, 108, 110 to form p-n junctions within neural nodes 102. The resulting p-n junctions may define the electrical pathways of VCMV(s) 116 between sets of conducting lines 106, 108, 110. The presence of doped semiconductor material within neural nodes 102 is depicted in schematic form within neural nodes 102. In further implementations, neural nodes 102 may be formed to at least partially include non-substrate material to provide VCMV (s) 116 and/or other amplifier components coupled to conducting lines 106, 108, 110. In any case, the formed neural nodes 102 may be planarized to a desired height (e.g., the upper surface of interconnect 104) after being formed. In further embodiments, neural nodes 102 may take the form of planarly-formed conductive metals, and/or other conductive materials which do not include semiconductors therein. Forming neural nodes 102 within openings 132, as shown, will create an electrical pathway between neural nodes 102 through interconnect stack 104. Specifically, conducting lines 106, 108, 110 and memory via(s) 114 will provide an electrical pathway for propagating signals from one neural node 102 to another in structure 100.

To deliver power to VCMV(s) 116, neural nodes 102 may be coupled to a voltage source (V) through one or more of the various conducting lines 106, 108, 110 abutting neural node 102. Voltage source(s) V may be integrated into a portion of the device outside structure 100, or may be included on any electrical structure coupled to neural node 100 through interconnect stack 104. Each voltage source(s) V may supply an alternating current (AC) voltage for amplifying input and/or output signals within structure 100, and each may supply an independent voltage by being coupled to ground (GND). Voltage source(s) V may represent supply voltage Vss (FIG. 5) and/or reference voltage Vref (FIG. 5).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A neuromorphic circuit structure, comprising:
    a first vertically-extending neural node configured to generate an output signal based on at least one input to the first vertically-extending neural node;
    an interconnect stack adjacent the vertically-extending neural node, the interconnect stack including a first conducting line coupled to the first vertically-extending neural node and configured to receive the output signal, a second conducting line vertically separated from the first conducting line, and a memory via vertically coupling the first conducting line to the second conducting line; and
    a second vertically-extending neural node adjacent the interconnect stack, and coupled to the second conducting line for receiving the output signal from the first vertically-extending neural node.

2. The neuromorphic circuit structure of claim 1, wherein the interconnect stack further includes a dielectric layer positioned between the first and second conducting line, and wherein the memory via extends vertically through the dielectric layer.

3. The neuromorphic circuit structure of claim 1, wherein the memory via comprises a uni-directional memristor.

4. The neuromorphic circuit structure of claim 3, wherein the memristor includes a titanium oxide ($TiO_{2-x}$) material.

5. The neuromorphic circuit structure of claim 1, wherein the second conducting line is configured to transmit one of an excitatory input signal or an inhibitory input signal to the second vertically-extending neural node.

6. The neuromorphic circuit structure of claim 1, wherein the first vertically-extending neural node includes a voltage-controlled monostable vibrator configured to generate output signal, wherein a frequency of the output signal is based on a difference between the at least one input to the first vertically-extending neural node and a reference voltage.

7. The neuromorphic circuit structure of claim 6, wherein the vertically-extending neural node includes a silicon substrate, and wherein the voltage-controlled monostable vibrator is formed within the silicon substrate.

8. A neuromorphic circuit structure, comprising:
    a first vertically-extending neural node configured to receive at least one excitatory input signal, and at least one inhibitory input signal, wherein the first vertically-extending neural node generates an output signal based on the at least one excitatory input signal and the at least one inhibitory input signal;
    an interconnect stack adjacent the vertically-extending neural node, the interconnect stack including a plurality of conducting lines alternating with a plurality of dielectric layers, wherein a first conducting line of the interconnect stack is coupled to the first vertically-extending neural node and configured to receive the output signal, one of the plurality of dielectric layers separates the first conducting line from a second conducting line of the interconnect stack, and a memory via vertically couples the first conducting line to the second conducting line; and
    a second vertically-extending neural node adjacent the interconnect stack, and coupled to the second conducting line for receiving the output signal from the first vertically-extending neural node.

9. The neuromorphic circuit structure of claim 8, wherein the memory via comprises a uni-directional memristor.

10. The neuromorphic circuit structure of claim 9, wherein the memristor includes a titanium oxide ($TiO_{2-x}$) material.

11. The neuromorphic circuit structure of claim 8, wherein the first vertically-extending neural node includes a voltage-controlled monostable vibrator configured to generate the output signal, wherein a frequency of the output signal is based on an input voltage to the voltage-controlled mono stable vibrator, and a reference voltage.

12. The neuromorphic circuit structure of claim 11, wherein the input voltage to the voltage-controlled mono stable vibrator is proportionate to a voltage difference between the at least one excitatory input signal and the at least one inhibitory input signal.

13. The neuromorphic circuit structure of claim 8, wherein the first vertically-extending neural node includes a silicon substrate, and wherein the voltage-controlled monostable vibrator is formed within the silicon substrate.

14. The neuromorphic circuit structure of claim 8, wherein the first vertically-extending neural node is coupled to a set of at least ten memory vias, the set of at least ten memory vias configured to transmit the at least one excitatory input signal and the at least one inhibitory input signal to the first vertically-extending neural node.

15. A method to form a neuromorphic circuit structure, the method comprising:
- forming a first conducting line;
- forming an dielectric layer on the first conducting line;
- forming a memory via within the dielectric layer in contact with the first conducting line;
- forming a second conducting line on the dielectric layer, such that the memory via vertically connects the second conducting line to the first conducting line;
- forming a first opening and a second opening by removing respective portions of the first conducting line, the dielectric layer, and the second conducting line at locations horizontally displaced from the via, wherein the first opening is positioned directly alongside the first conducting line and the second opening is positioned directly alongside the second conducting line;
- forming a first and second vertically-extending neural node respectively within the first opening and the second opening, the first vertically-extending neural node being coupled to the first conducting line, and the second vertically extending neural node being coupled to the second conducting line.

16. The method of claim 15, further comprising forming a plurality of additional conducting lines and dielectric layers to form an interconnect stack, before forming the pair of openings.

17. The method of claim 15, wherein forming one of the pair of vertically-extending neural nodes includes forming a voltage-controlled monostable vibrator coupled to the first conducting line or the second conducting line.

18. The method of claim 17, further comprising coupling a reference terminal of the voltage-controlled monostable vibrator to a voltage source.

19. The method of claim 15, wherein forming the memory via includes forming a memristor material.

20. The method of claim 19, wherein forming the memristor material includes depositing a titanium oxide ($TiO_{2-x}$) material over the first conducting line.

* * * * *